United States Patent
Bhatia et al.

(10) Patent No.: US 7,951,730 B2
(45) Date of Patent: May 31, 2011

(54) DECREASING THE ETCH RATE OF SILICON NITRIDE BY CARBON ADDITION

(75) Inventors: Ritwik Bhatia, Albany, NY (US); Li-Qun Xia, Santa Clara, CA (US); Chad Peterson, San Jose, CA (US); Hichem M'Saad, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/365,669

(22) Filed: Feb. 4, 2009

(65) Prior Publication Data
US 2009/0137132 A1    May 28, 2009

Related U.S. Application Data

(63) Continuation of application No. 11/478,273, filed on Jun. 29, 2006, now Pat. No. 7,501,355.

(51) Int. Cl.
*H01L 21/31* (2006.01)
*H01L 21/469* (2006.01)

(52) U.S. Cl. .... 438/791; 438/793; 438/794; 257/E21.24

(58) Field of Classification Search .............. None
See application file for complete search history.

(56) References Cited

U.S. PATENT DOCUMENTS

| | | | |
|---|---|---|---|
| 4,091,169 A | 5/1978 | Bohg et al. | |
| 4,894,352 A * | 1/1990 | Lane et al. | 438/763 |
| 5,300,322 A | 4/1994 | Lowden | |
| 5,374,570 A | 12/1994 | Nasu et al. | |
| 5,503,875 A | 4/1996 | Imai et al. | |
| 5,772,773 A | 6/1998 | Wytman | |
| 5,916,365 A | 6/1999 | Sherman | |
| 6,079,356 A | 6/2000 | Umotoy et al. | |
| 6,090,442 A | 7/2000 | Klaus et al. | |
| 6,103,014 A | 8/2000 | Lei et al. | |
| 6,153,261 A | 11/2000 | Xia et al. | |
| 6,200,893 B1 | 3/2001 | Sneh | |
| 6,207,487 B1 | 3/2001 | Kim et al. | |
| 6,245,192 B1 | 6/2001 | Dhindsa et al. | |

(Continued)

FOREIGN PATENT DOCUMENTS

EP    0835950    4/1998

(Continued)

OTHER PUBLICATIONS

George, et al "Surface Chemistry for Atomic Layer Growth", *J.Phys. Chem.* 1996, vol. 100, No. 31, pp. 13121-13131.

(Continued)

*Primary Examiner* — Julio J Maldonado
*Assistant Examiner* — Shaka Scarlett
(74) *Attorney, Agent, or Firm* — Patterson & Sheridan

(57) ABSTRACT

Methods for forming silicon nitride hard masks are provided. The silicon nitride hard masks include carbon-doped silicon nitride layers and undoped silicon nitride layers. Carbon-doped silicon nitride layers that are deposited from a mixture comprising a carbon source compound, a silicon source compound, and a nitrogen source in the presence of RF power are provided. Also provided are methods of UV post-treating silicon nitride layers to provide silicon nitride hard masks. The carbon-doped silicon nitride layers and UV post-treated silicon nitride layers have desirable wet etch rates and dry etch rates for hard mask layers.

14 Claims, 2 Drawing Sheets

U.S. PATENT DOCUMENTS

| | | |
|---|---|---|
| 6,270,572 B1 | 8/2001 | Kim et al. |
| 6,271,054 B1 | 8/2001 | Ballantine et al. |
| 6,277,200 B2 | 8/2001 | Xia et al. |
| 6,284,646 B1 | 9/2001 | Leem et al. |
| 6,287,965 B1 | 9/2001 | Kang et al. |
| 6,305,314 B1 | 10/2001 | Sneh et al. |
| 6,326,658 B1 | 12/2001 | Tsunashima et al. |
| 6,333,547 B1 | 12/2001 | Tanaka et al. |
| 6,342,277 B1 | 1/2002 | Sherman |
| 6,351,013 B1 | 2/2002 | Luning et al. |
| 6,379,466 B1 | 4/2002 | Sahin et al. |
| 6,391,785 B1 | 5/2002 | Satta et al. |
| 6,391,803 B1 | 5/2002 | Kim et al. |
| 6,399,491 B2 | 6/2002 | Jeon et al. |
| 6,436,824 B1 | 8/2002 | Chooi et al. |
| 6,451,119 B2 | 9/2002 | Sneh et al. |
| 6,455,417 B1 * | 9/2002 | Bao et al. .................. 438/637 |
| 6,462,371 B1 | 10/2002 | Weimer et al. |
| 6,468,924 B2 | 10/2002 | Lee et al. |
| 6,500,266 B1 | 12/2002 | Ho et al. |
| 6,511,539 B1 | 1/2003 | Raaijmakers et al. |
| 6,528,430 B2 | 3/2003 | Kwan et al. |
| 6,534,395 B2 | 3/2003 | Werkhoven et al. |
| 6,559,074 B1 | 5/2003 | Chen et al. |
| 6,562,702 B2 | 5/2003 | Yagi |
| 6,566,246 B1 | 5/2003 | de Felipe et al. |
| 6,566,278 B1 | 5/2003 | Harvey et al. |
| 6,582,522 B2 | 6/2003 | Luo et al. |
| 6,586,343 B1 | 7/2003 | Ho et al. |
| 6,590,251 B2 | 7/2003 | Kang et al. |
| 6,597,003 B2 | 7/2003 | Janos et al. |
| 6,613,637 B1 | 9/2003 | Lee et al. |
| 6,614,181 B1 | 9/2003 | Harvey et al. |
| 6,616,986 B2 | 9/2003 | Sherman |
| 6,620,670 B2 | 9/2003 | Song et al. |
| 6,624,088 B2 | 9/2003 | Moore |
| 6,630,413 B2 | 10/2003 | Todd |
| 6,652,924 B2 | 11/2003 | Sherman |
| 6,660,660 B2 | 12/2003 | Haukka et al. |
| 6,664,192 B2 | 12/2003 | Satta et al. |
| 6,696,332 B2 | 2/2004 | Visokay et al. |
| 6,703,708 B2 | 3/2004 | Werkhoven et al. |
| 6,720,027 B2 | 4/2004 | Yang et al. |
| 6,730,175 B2 | 5/2004 | Yudovsky et al. |
| 6,740,605 B1 | 5/2004 | Shiraiwa et al. |
| 6,743,681 B2 | 6/2004 | Bhattacharyya |
| 6,756,085 B2 | 6/2004 | Waldfried et al. |
| 6,759,321 B2 | 7/2004 | Babich et al. |
| 6,764,546 B2 | 7/2004 | Raaijmakers |
| 6,773,507 B2 | 8/2004 | Jallepally et al. |
| 6,777,352 B2 | 8/2004 | Tepman et al. |
| 6,790,755 B2 | 9/2004 | Jeon |
| 6,794,215 B2 | 9/2004 | Park et al. |
| 6,825,134 B2 | 11/2004 | Law et al. |
| 6,827,815 B2 | 12/2004 | Hytros et al. |
| 6,828,218 B2 | 12/2004 | Kim et al. |
| 6,828,245 B2 * | 12/2004 | Chang ....................... 438/709 |
| 6,833,310 B2 | 12/2004 | Kim et al. |
| 6,846,516 B2 | 1/2005 | Yang et al. |
| 6,846,743 B2 | 1/2005 | Endo et al. |
| 6,893,985 B2 | 5/2005 | Goodner |
| 2001/0030369 A1 | 10/2001 | MacNeil et al. |
| 2002/0060363 A1 | 5/2002 | Xi et al. |
| 2002/0117399 A1 | 8/2002 | Chen et al. |
| 2002/0164890 A1 | 11/2002 | Kwan et al. |
| 2002/0179934 A1 | 12/2002 | Cheng et al. |
| 2002/0179982 A1 | 12/2002 | Cheng et al. |
| 2003/0010451 A1 | 1/2003 | Tzu et al. |
| 2003/0015669 A1 | 1/2003 | Janos et al. |
| 2003/0032281 A1 | 2/2003 | Werkhoven et al. |
| 2003/0054115 A1 | 3/2003 | Albano et al. |
| 2003/0072884 A1 | 4/2003 | Zhang et al. |
| 2003/0072975 A1 | 4/2003 | Shero et al. |
| 2003/0101927 A1 | 6/2003 | Raaijmakers |
| 2003/0108674 A1 | 6/2003 | Chung et al. |
| 2003/0124262 A1 | 7/2003 | Chen et al. |
| 2003/0124818 A1 | 7/2003 | Luo et al. |
| 2003/0132319 A1 | 7/2003 | Hytros et al. |
| 2003/0136520 A1 | 7/2003 | Yudovsky et al. |
| 2003/0143841 A1 | 7/2003 | Yang et al. |
| 2003/0160277 A1 | 8/2003 | Bhattacharyya |
| 2003/0166318 A1 | 9/2003 | Zheng et al. |
| 2003/0172872 A1 | 9/2003 | Thakur et al. |
| 2003/0185980 A1 | 10/2003 | Endo |
| 2003/0189232 A1 | 10/2003 | Law et al. |
| 2003/0198754 A1 | 10/2003 | Xi et al. |
| 2003/0213560 A1 | 11/2003 | Wang et al. |
| 2003/0215570 A1 | 11/2003 | Seutter et al. |
| 2003/0216981 A1 | 11/2003 | Tillman |
| 2003/0232554 A1 | 12/2003 | Blum et al. |
| 2003/0235961 A1 | 12/2003 | Metzner et al. |
| 2004/0033678 A1 | 2/2004 | Arghavani et al. |
| 2004/0058090 A1 | 3/2004 | Waldfried et al. |
| 2004/0096593 A1 | 5/2004 | Lukas et al. |
| 2004/0096672 A1 | 5/2004 | Lukas et al. |
| 2004/0099283 A1 | 5/2004 | Waldfried et al. |
| 2004/0175501 A1 | 9/2004 | Lukas et al. |
| 2004/0175957 A1 | 9/2004 | Lukas et al. |
| 2004/0194701 A1 | 10/2004 | Yadav et al. |
| 2004/0203255 A1 | 10/2004 | Itsuki |
| 2004/0259386 A1 | 12/2004 | Tanaka et al. |
| 2005/0064726 A1 | 3/2005 | Reid et al. |
| 2005/0109276 A1 | 5/2005 | Iyer et al. |
| 2005/0233555 A1 | 10/2005 | Rajagopalan et al. |
| 2005/0287747 A1 | 12/2005 | Chakravarti et al. |
| 2006/0084283 A1 | 4/2006 | Paranjpe et al. |
| 2006/0199357 A1 * | 9/2006 | Wan et al. ................... 438/482 |
| 2006/0228903 A1 | 10/2006 | McSwiney et al. |
| 2006/0251827 A1 | 11/2006 | Nowak et al. |
| 2006/0286818 A1 | 12/2006 | Wang et al. |
| 2006/0286819 A1 | 12/2006 | Seutter et al. |

FOREIGN PATENT DOCUMENTS

| | | |
|---|---|---|
| JP | 01143221 | 6/1989 |
| JP | 07300649 | 11/1995 |
| JP | 2001111000 | 4/2001 |
| WO | WO-0016377 | 3/2000 |
| WO | WO-0054320 | 9/2000 |
| WO | WO-0115220 | 3/2001 |
| WO | WO-0117692 | 3/2001 |
| WO | WO-0129893 | 4/2001 |
| WO | WO-0166832 | 9/2001 |

OTHER PUBLICATIONS

Lee, et al. "Cyclic technique for the enhancement of highly oriented diamond film growth", Thin Solid Films 303 (1997) pp. 264-268.

Min, et al. "Chemical Vapor Deposition of Ti-Si-N Films with Alternating Source Supply", Mat. Res. Soc. Symp. Proc. 1999, vol. 564, pp. 207-211.

Min, et al. "Metal—organic atomic-layer deposition of titanium-silicon-nitride films", *Appl. Phys. Lett.*, vol. 75 No. 11, 1999, pp. 1521-1523.

Sugano, et al. "Etching rate control of mask material for XeF2 etching using UV exposure", Micromachining and Microfabrication Process Technology VII, Proceedings of SPIE vol. 4557 (2001).

PCT Invitation to Pay Additional Fees, dated Jan. 12, 2005 for PCT/US2004/027584.

International Search Report and Written Opinion of the International Searching Authority dated Apr. 11, 2005 for International Application No. PCT/US2004/027584.

English translation of First Office Action dated Nov. 7, 2008, Chinese Patent Application No. 200710126049.1.

English translation of Notice of Registration and Grant dated Jun. 5, 2009, Chinese Patent Application No. 200710126049.1.

\* cited by examiner

DECREASING THE ETCH RATE OF SILICON NITRIDE BY CARBON ADDITION

CROSS-REFERENCE TO RELATED APPLICATIONS

This application is a continuation of co-pending U.S. patent application Ser. No. 11/478,273, filed Jun. 29, 2006, now issued as U.S. Pat. No. 7,501,355, which is herein incorporated by reference.

BACKGROUND OF THE INVENTION

1. Field of the Invention

Embodiments of the present invention generally relate to the fabrication of integrated circuits. More particularly, embodiments of the present invention relate to methods for forming silicon nitride hard masks.

2. Description of the Related Art

Integrated circuits have evolved into complex devices that can include millions of transistors, capacitors and resistors on a single chip. The evolution of chip designs continually requires faster circuitry and greater circuit density. The demands for faster circuits with greater circuit densities impose corresponding demands on the materials used to fabricate such integrated circuits.

The demands for greater integrated circuit densities also impose demands on the process sequences used for integrated circuit manufacture. For example, in process sequences using conventional lithographic techniques, a layer of energy sensitive resist, such as a photoresist, is formed over a stack of layers on a substrate. An image of a pattern is introduced into the energy sensitive resist layer. Then, the pattern introduced into the energy sensitive resist layer is transferred into one or more layers of the stack of layers formed on the substrate using the layer of energy sensitive resist as a mask. The pattern introduced into the energy sensitive resist can be transferred into one or more layers of the material stack using a chemical etchant. The chemical etchant is designed to have a greater etch selectivity for the material layers of the stack than for the energy sensitive resist. That is, the chemical etchant etches the one or more layers of the material stack at a much faster rate than it etches the energy sensitive resist. The faster etch rate for the one or more material layers of the stack typically prevents the energy sensitive resist material from being consumed prior to completion of the pattern transfer.

However, demands for greater circuit densities on integrated circuits have necessitated smaller pattern dimensions (e.g., sub-micron or nanometer dimensions). As the pattern dimensions are reduced, the thickness of the energy sensitive resist must correspondingly be reduced in order to control pattern resolution. Such thinner resist layers can be insufficient to mask underlying layers during a pattern transfer step using a chemical etchant.

An intermediate layer, called a hard mask, is often used between the energy sensitive resist layer and the underlying layers to facilitate pattern transfer into the underlying layers. Like the energy sensitive resist layers, hard mask layers must be more resistant to the etchant that is used to etch an underlying layer in order to prevent erosion of the hard mask before the etching of the underlying layer is completed.

Silicon nitride layers that can be used as hard masks have been developed. The silicon nitride layers are typically deposited by a thermal process in a furnace at a high temperature, such as 800° C. Such high temperatures are disadvantageous for processes with stringent thermal budget demands, such as in very large scale or ultra-large scale integrated circuit (VLSI or ULSI) device fabrication.

Thus, there remains a need for methods of depositing silicon nitride layers at lower temperatures, wherein the silicon nitride layers have etch rate properties that enable them to be used as hard mask layers.

SUMMARY OF THE INVENTION

The present invention generally provides methods of forming silicon nitride hard masks. The silicon nitride hard masks may be silicon nitride layers or carbon-doped silicon nitride layers.

In one embodiment, a method of forming a carbon-doped silicon nitride hard mask includes introducing a carbon source compound into a chamber, introducing a silicon source compound into the chamber, introducing a nitrogen source into the chamber, and reacting the carbon source compound, silicon source compound, and nitrogen source in the presence of RF power to deposit a carbon-doped silicon nitride hard mask on a substrate in the chamber.

In another embodiment, a method of forming a carbon-doped silicon nitride hard mask includes introducing trimethylsilane into a chamber at a first flow rate, introducing silane into the chamber at a second flow rate, wherein the ratio of the second flow rate to the first flow rate is between about 50:1 and about 1:1, e.g., between about 10:1 and about 1:1, introducing $NH_3$ into the chamber, and reacting the trimethylsilane, silane, and $NH_3$ in the presence of RF power to deposit a carbon-doped silicon nitride hard mask on a substrate in the chamber.

In a further embodiment, a method of forming a silicon nitride hard mask is provided. The method comprises introducing a silicon source compound into the chamber, introducing a nitrogen source into the chamber, reacting the silicon source compound and a nitrogen source in the presence of RF power to deposit a silicon nitride layer on a substrate in the chamber, and UV post-treating the silicon nitride layer to form a silicon nitride hard mask. Carbon-doped silicon nitride layers that are deposited by reacting a carbon source compound, a silicon source compound, and a nitrogen source in the presence of RF power may also be UV post-treated.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention provides methods of depositing silicon nitride layers that can be used as hard masks. For example, a silicon nitride layer can be patterned, and the pattern formed in the silicon nitride layer can be transferred through a layer of a substrate. As defined herein, a "substrate" may include one or more layers, such as a stack of layers.

Figure 1A:
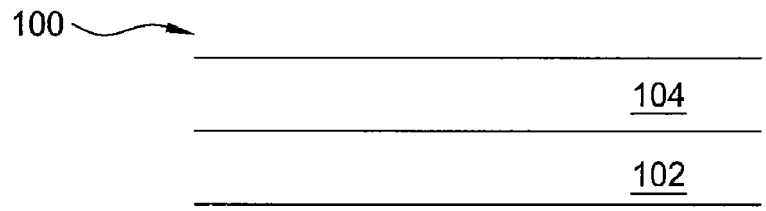
FIGS. 1A-1D depict schematic cross-sectional views of a substrate structure at different stages of a process sequence according to an embodiment of the invention.
Figure 1B:
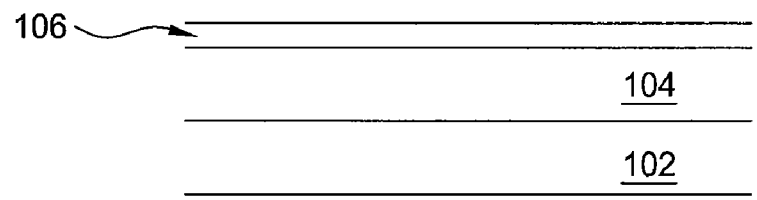
Figure 1C:
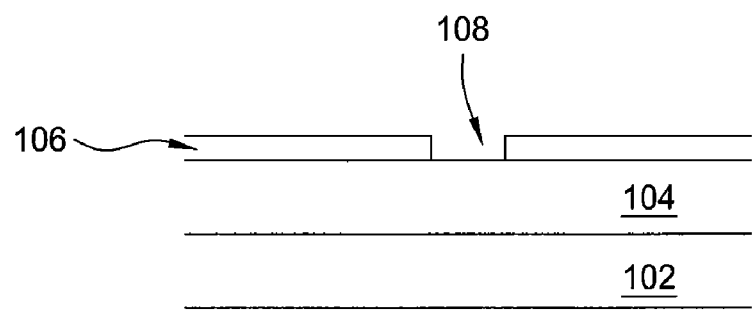
Figure 1D:
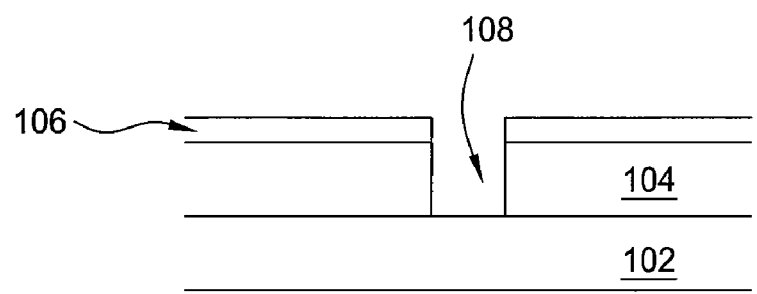

FIGS. 1A-1D show an example of a process sequence according to an embodiment of the invention. FIG. 1A shows a substrate 100 comprising an underlying layer 102 and a layer 104 on top of the layer 102. FIG. 1B shows a silicon nitride layer 106 of the invention that has been deposited on layer 104 of the substrate 100. FIG. 1C shows a feature 108 that has been formed in silicon nitride layer 106 such that layer 106 is patterned. FIG. 1D shows that the feature 108 in layer 106 has been transferred through the layer 104. Conventional patterning and etching techniques may be used to pattern and etch the silicon nitride layer 106 and the layer 104.

The substrate 100 may be part of a larger structure (not shown), such as a STI (shallow trench isolation) structure, a gate device for a transistor, a DRAM device, or a dual damascene structure, and thus, the silicon nitride layer may be used as a hard mask to pattern layers that are part of STI structures, a gate devices, DRAM devices, or dual damascene structures. The hard mask may be left in the structures after is it used to pattern an underlying layer or it may be removed after the patterning is completed.

The silicon nitride layers provided herein include carbon-doped silicon nitride layers and silicon nitride layers that do not contain carbon. The silicon nitride layers may be deposited to achieve layers of different thicknesses, such as thicknesses of between about 300 Å and about 5000 Å. In one embodiment, a carbon-doped silicon nitride layer is deposited on a substrate in a chamber by reacting a carbon source compound, a silicon source compound, and a nitrogen source in the chamber. The carbon-doped silicon nitride layer is deposited using plasma enhanced chemical vapor deposition (PECVD) in a chamber capable of performing chemical vapor deposition (CVD). The plasma may be generated using constant radio frequency (RF) power, pulsed RF power, high frequency RF power, dual frequency RF power, combinations thereof, or other plasma generation techniques.

The carbon source compound provides carbon to the deposited layers and may be an organosilicon compound. Alternatively, the carbon source compound may be an organic compound, such as a hydrocarbon compound, e.g., ethylene, or a compound comprising carbon, nitrogen, and hydrogen, instead of an organosilicon compound.

The term "organosilicon compound" as used herein is intended to refer to silicon-containing compounds containing carbon atoms in organic groups. Organic groups may include alkyl, alkenyl, cyclohexenyl, and aryl groups in addition to functional derivatives thereof. In certain embodiments, the organosilicon compound does not contain oxygen.

The organosilicon compound can be cyclic or linear. Suitable cyclic organosilicon compounds include a ring structure having three or more silicon atoms. An example of a cyclic organosilicon compound that may be used is 1,3,5-trisilano-2,4,6-trimethylene, —(—$SiH_2CH_2$—)$_3$—.

Suitable linear organosilicon compounds include aliphatic organosilicon compounds having linear or branched structures with one or more silicon atoms and one or more carbon atoms. Some exemplary linear organosilicon compounds include:
  methylsilane, $CH_3$—$SiH_3$
  dimethylsilane, $(CH_3)_2$—$SiH_2$
  trimethylsilane, $(CH_3)_3$—$SiH$
  ethylsilane, $CH_3$—$CH_2$—$SiH_3$
  disilanomethane, $SiH_3$—$CH_2$—$SiH_3$
  bis(methylsilano)methane, $CH_3$—$SiH_2$—$CH_2$—$SiH_2$—$CH_3$
  1,2-disilanoethane, $SiH_3$—$CH_2$—$CH_2$—$SiH_3$
  1,2-bis(methylsilano)ethane, $CH_3$—$SiH_2$—$CH_2$—$CH_2$—$SiH_2$—$CH_3$
  2,2-disilanopropane, $SiH_3$—$C(CH_3)_2$—$SiH_3$
  diethylsilane, $(C_2H_5)_2$—$SiH_2$
  propylsilane, $C_3H_7$—$SiH_3$
  vinylmethylsilane, $(CH_2=CH)$—$SiH_2$—$CH_3$
  1,1,2,2-tetramethyldisilane, $(CH_3)_2$—$SiH$—$SiH$—$(CH_3)_2$
  hexamethyldisilane, $(CH_3)_3$—$Si$—$Si$—$(CH_3)_3$
  1,1,2,2,3,3-hexamethyltrisilane, $(CH_3)_2$—$SiH$—$Si(CH_3)_2$—$SiH$—$(CH_3)_2$
  1,1,2,3,3-pentamethyltrisilane, $(CH_3)_2$—$SiH$—$SiH(CH_3)$—$SiH$—$(CH_3)_2$
  1,3-bis(methylsilano)propane, $CH_3$—$SiH_2$—$(CH_2)_3$—$SiH_2$—$CH_3$
  1,2-bis(dimethylsilano)ethane, $(CH_3)_2$—$SiH$—$(CH_2)_2$—$SiH$—$(CH_3)_2$ and
  1,3-bis(dimethylsilano)propane, $(CH_3)_2$—$SiH$—$(CH_2)_3$—$SiH$—$(CH_3)_2$.

The silicon source compound provides silicon to the deposited layers and may be silane or tetrathoxysilane (TEOS). In certain embodiments, the non carbon-containing silicon compound is silane.

The nitrogen source provides nitrogen to the deposited layers and may be ammonia ($NH_3$) or nitrogen gas ($N_2$). In certain embodiments, the nitrogen source is ammonia ($NH_3$).

Any chamber that is capable of performing plasma enhanced chemical vapor deposition may be used to deposit the carbon-doped silicon nitride layers and undoped silicon nitride provided herein. A PRODUCER® SE BLOK® chamber and a PRODUCER® SE silane chamber are two examples of chemical vapor deposition chambers that may be used. Both chambers are available from Applied Materials, Inc. of Santa Clara, Calif. An exemplary PRODUCERS® chamber is further described in U.S. Pat. No. 5,855,681, which is herein incorporated by reference.

The carbon source compound may be introduced into the chamber at a flow rate of between about 2 sccm and about 2000 sccm. The silicon source compound may be introduced into the chamber at a flow rate of between about 20 sccm and about 2000 sccm. The nitrogen source may be introduced into the chamber at a flow rate of between about 100 sccm and about 15000 sccm. Optionally, a carrier gas is introduced into the chamber at a flow rate of between about 0 sccm and about 20000 sccm. The carrier gas may be nitrogen gas or an inert gas. The flow rates are chosen such that only a small amount of carbon is incorporated into the deposited silicon nitride layer, providing a lightly carbon-doped silicon nitride layer. For example, the carbon source compound may be introduced into the chamber at a first flow rate, and the silicon source compound may be introduced into the chamber at a second flow rate such that the ratio of the second flow rate to the first flow rate is between about 50:1 and about 1:1, such as between about 10:1 and about 1:1, e.g., about 7:1. In certain embodiments, the carbon source compound is trimethylsilane, the silicon source compound is silane, the nitrogen source is ammonia, and the carrier gas is nitrogen.

The flow rates described above and throughout this application are provided with respect to a 300 mm chamber having two isolated processing regions, such as PRODUCER® SE chambers, available from Applied Materials, Inc. of Santa Clara, Calif. Thus, the flow rates experienced per each substrate processing region are half of the flow rates into the chamber.

During deposition of the carbon-doped silicon nitride layer on the substrate in the chamber, the substrate is typically maintained at a temperature between about 200° C. and about 700° C., preferably between about 480° C. and about 600° C., such as about 550° C. A RF power level of between about 20 W and about 1600 W for a 300 mm substrate is typically used in the chamber. The RF power is provided at a frequency between about 0.01 MHz and 300 MHz, preferably 13.56 MHz. The RF power is typically provided to a gas distribution assembly or "showerhead" electrode in the chamber. Alternatively or additionally, the RF power may be applied to a substrate support in the chamber. The RF power may be provided at a mixed frequency, such as at a high frequency of about 13.56 MHz and a low frequency of about 350 kHz. The RF power may be cycled or pulsed and continuous or discontinuous.

The spacing between the showerhead and substrate support during the deposition of the carbon-doped silicon nitride layer may be between about 280 mils and about 1500 mils, and the pressure in the chamber may be between about 1 Torr and about 8 Torr.

Figure 2:
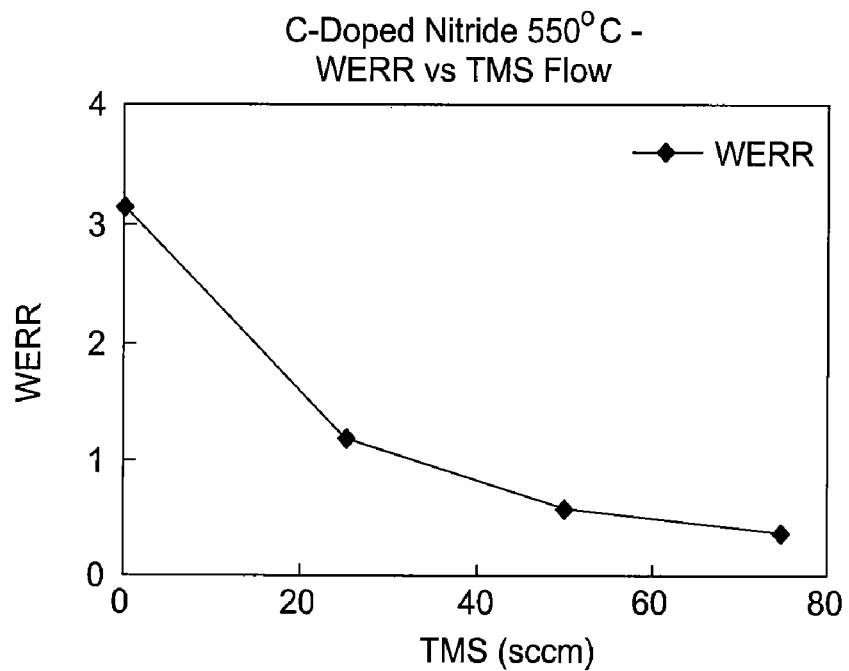
FIG. 2 is a graph showing the wet etch rate ratios of carbon-doped silicon nitride layers provided according to embodiments of the invention.

FIG. 2 is a graph showing the wet etch rate ratios of carbon-doped silicon nitride layers deposited using different amounts of trimethylsilane as the organosilicon compound according to embodiments of the invention. As shown in FIG. 2, the wet etch rate ratios decreased as the flow rate of trimethylsilane that was used to deposit the layers was increased.

Figure 3:
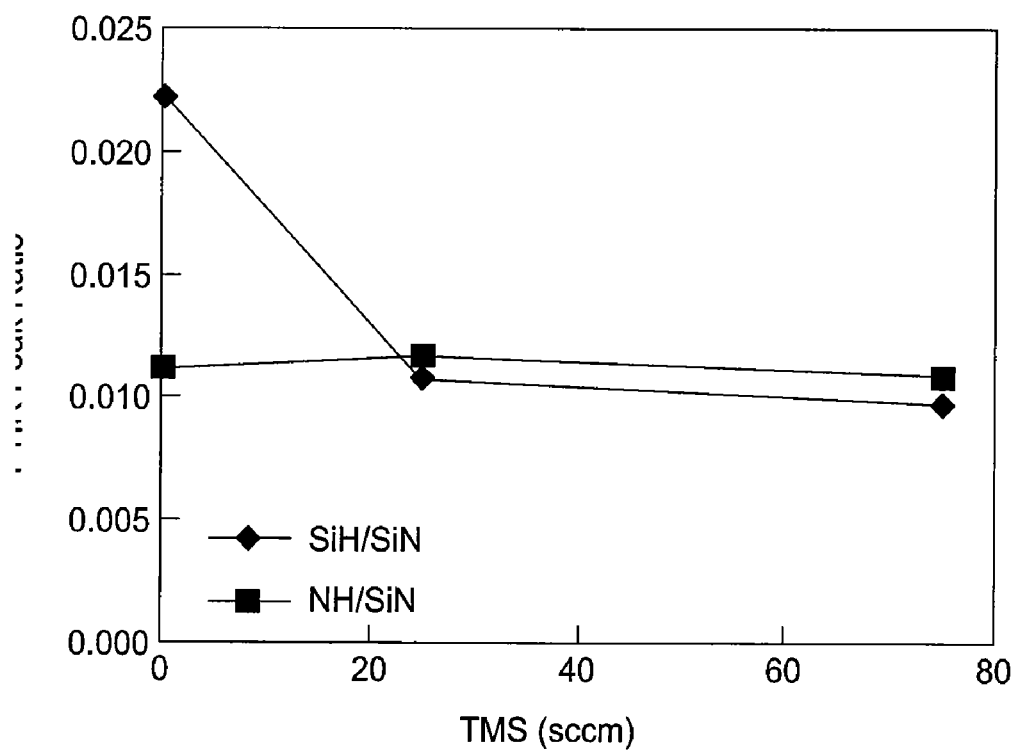
FIG. 3 is a graph showing FTIR peak ratios of carbon-doped silicon nitride layers provided according to embodiments of the invention.

FTIR analysis (not shown) of the carbon-doped silicon nitride layers indicates that the layers are very lightly carbon-doped, as Si—C and C—C bonds are not detected. However, the carbon-doped silicon nitride layers had a detectable difference (relative to silicon nitride layers deposited without an organosilicon compound) in the ratio of Si—H to Si—N bonds, as shown in FIG. 3.

In another embodiment, a silicon nitride hard mask is provided by reacting a silicon source compound and a nitrogen source in the presence of RF power to deposit a silicon nitride layer on a substrate in a chamber and then UV post-treating the silicon nitride layer to form a silicon nitride hard mask.

The silicon source compound may be silane or tetrathoxysilane (TEOS). In certain embodiments, the non carbon-containing silicon compound is silane.

The nitrogen source may be ammonia ($NH_3$) or nitrogen gas ($N_2$). In certain embodiments, the nitrogen source is ammonia ($NH_3$).

The silicon source compound may be introduced into the chamber at a flow rate of between about 20 sccm and about 2000 sccm. The nitrogen source may be introduced into the chamber at a flow rate of between about 10 sccm and about 15000 sccm. Optionally, a carrier gas is introduced into the chamber at a flow rate of between about 0 sccm and about 20000 sccm. The carrier gas may be nitrogen gas or an inert gas.

During deposition of the silicon nitride layer on the substrate in the chamber, the substrate is typically maintained at a temperature between about 200-° C. and about 700° C., preferably between about 480° C. and about 600° C., such as about 550° C. A RF power level of between about 20 W and about 1600 W for a 300 mm substrate is typically used in the chamber. The RF power is provided at a frequency between about 0.01 MHz and 300 MHz, preferably 13.56 MHz. The RF power is typically provided to a gas distribution assembly or "showerhead" electrode in the chamber. Alternatively or additionally, the RF power may be applied to a substrate support in the chamber. The RF power may be provided at a mixed frequency, such as at a high frequency of about 13.56 MHz and a low frequency of about 350 kHz. The RF power may be cycled or pulsed and continuous or discontinuous.

The spacing between the showerhead and substrate support during the deposition of the silicon nitride layer may be between about 280 mils and about 1500 mils, and the pressure in the chamber may be between about 1 Torr and about 8 Torr.

After the silicon nitride layer is deposited, the layer is post-treated with UV radiation. Exemplary UV post-treatment conditions that may be used include a chamber pressure of between about 1 Torr and about 10 Torr and a substrate support temperature of between about 200° C. and about 500° C. A purge gas such as helium or argon is flowed into the chamber during the post-treatment. The UV post-treatment is typically performed for a period of time between about 1 minute and about 60 minutes, such as 30 minutes. The UV radiation may be provided by any UV source, such as mercury microwave arc lamps, e.g., a Nordson Hg lamp, pulsed xenon flash lamps, or high-efficiency UV light emitting diode arrays. The UV radiation may have a wavelength of between about 200 nm and about 400 nm, for example. The UV radiation can have a single ultraviolet wavelength or a broadband of ultraviolet wavelengths. A suitable exemplary single wavelength ultraviolet source comprises an excimer source that provides a single ultraviolet wavelength of 172 nm or 222 nm, for example. A suitable broadband source generates ultraviolet radiation having wavelengths of from about 200 to about 400 nm. Such ultraviolet sources can be obtained from Fusion Company, USA or Nordson Company, USA. Ultraviolet radiation having specific wavelengths that are generated by lamps that contain gas that radiates at specific wavelengths when electrically stimulated may be used. For example, a suitable ultraviolet lamp may comprise Xe gas, which generates ultraviolet radiation having a wavelength of 172 nm. Alternatively, the lamp may comprise other gases having different corresponding wavelengths, for example, mercury lamps that radiate at a wavelength of 243 nm, deuterium lamps that radiate at a wavelength of 140 nm, and $KrCl_2$ lamps that radiate at a wavelength of 222 nm. Further details of UV chambers and treatment conditions that may be used are described in commonly assigned U.S. patent application Ser. No. 11/124,908, filed on May 9, 2005, which is incorporated by reference herein. The NanoCure™ chamber from Applied Materials, Inc. is an example of a commercially available chamber that may be used for UV post-treatments.

While the UV post-treatment provided above was discussed with respect to post-treating silicon nitride layers that do not comprise carbon, the UV post-treatment provided above may also be performed on the carbon-doped silicon nitride layers provided according to certain embodiments of the invention.

The following examples illustrate embodiments of the invention. The substrates in the examples were 300 mm substrates. The carbon-doped silicon nitride layers and silicon nitride layers were deposited on the substrates in PRODUCER® SE chambers.

EXAMPLE 1

A carbon-doped silicon nitride layer was deposited on a substrate at about 2 Torr, a temperature of about 550° C., and a spacing of about 480 mils. The following process gases and flow rates were used: trimethylsilane at 50 sccm; silane at 340 sccm; ammonia at 3200 sccm; and nitrogen at 4000 sccm. The trimethylsilane, silane, and ammonia were reacted in the presence of RF power applied to a showerhead electrode in the chamber at 60 W and a frequency of 13.56 MHz and to the substrate support at 50 W and a frequency of 350 kHz for plasma enhanced deposition of a carbon-doped silicon nitride layer. The carbon-doped silicon nitride layer had a wet etch rate of 2.0 Å/min in 100:1 diluted hydrofluoric acid (HF), a wet etch rate ratio (WERR) of 0.6, a wet etch rate uniformity of 4.5%, and a dry etch selectivity ratio of 1.1. The dry etch selectivity ratio is the ratio of the over etch depth of the film of interest vs. thermal nitride. Other film properties that were obtained were a within wafer thickness uniformity of 1.12%, a refractive index of 1.984, a stress of 66 MPa, a leakage current of $3.2 \times 10^{-9}$ at 2 MV/cm, and a breakdown voltage of 6.9 MV/cm.

EXAMPLE 2

A silicon nitride layer was deposited on a substrate at about 2 Torr, a temperature of about 550° C., and a spacing of about 480 mils. The following process gases and flow rates were used: silane at 340 sccm; ammonia at 3200 sccm; and nitrogen at 4000 sccm. The silane and ammonia were reacted in the presence of RF power applied to a showerhead electrode in the chamber at 60 W and a frequency of 13.56 MHz and to the substrate support at 50 W and a frequency of 350 kHz for plasma enhanced deposition of a silicon nitride layer. The silicon nitride layer had a wet etch rate of 6.4 Å/min in 100:1 diluted hydrofluoric acid (HF), a wet etch rate uniformity of 2.6%, and a dry etch selectivity ratio of 1.25. Other film properties that were obtained were a within wafer thickness uniformity of 0.98%, a refractive index of 2.0077, a stress of −807 MPa, a leakage current of $2.0 \times 10^{-9}$ at 2 MV/cm, and a breakdown voltage of 8.4 MV/cm.

The silicon nitride layer was then UV post-treated for 30 minutes using the following process conditions: a helium flow rate of 9 standard liters per minute (slm), a temperature of about 400° C., a pressure of about 8 Torr, and a spacing of about 800 mils. The UV treated silicon nitride layer had a wet etch rate of 5.7 Å/min in 100:1 diluted hydrofluoric acid (HF), a wet etch rate uniformity of 4.23%, and a dry etch selectivity ratio of 1.0. Other film properties that were obtained were a within wafer thickness uniformity of 1.18%, a refractive index of 2.0069, a stress of −750 MPa, a leakage current of $3.0 \times 10^{-9}$ at 2 MV/cm, and a breakdown voltage of 7.4 MV/cm.

Returning to Example 1, it is noted that carbon-doped silicon nitride layers having a wet etch rate of 2.0 Å/min can be formed according to embodiments of the invention at a deposition temperature of 550° C. This is a significant improvement compared to a wet etch rate of 3.2 Å/min that was measured for undoped silicon nitride layers depositing in a thermal, i.e., not plasma enhanced, process at 800° C. in a furnace. The dry etch selectivity ratio of 1.1 obtained in Example 1 is comparable to the dry etch selectivity ratio of 1.0 that was measured for undoped silicon nitride layers depositing in the thermal process described above. The leakage current of the carbon-doped silicon nitride layer was similar to the leakage current of a thermally deposited, undoped silicon nitride layer, and only a small effect on the breakdown voltage of the carbon-doped silicon nitride layer was observed.

Example 2 illustrates that the UV post-treatment provided herein improved the wet etch rate of an undoped silicon nitride layer deposited in the presence of RF power in a PECVD process from 6.4 Å/min to 5.7 Å/min. The UV post-treatment also improved the dry etch selectivity ratio from 1.25 pre-treatment to 1.00 post-treatment, which is the dry etch selectivity ratio measured for undoped silicon nitride layers depositing in a thermal process at 800° C. in a furnace.

Thus, embodiments of the invention provide silicon nitride layers that are deposited using plasma-enhanced deposition and have at least comparable or improved etch rates relative to thermally deposited silicon nitride layers.

While the foregoing is directed to embodiments of the present invention, other and further embodiments of the invention may be devised without departing from the basic scope thereof, and the scope thereof is determined by the claims that follow.

What is claimed is:

1. A method of forming a carbon-doped silicon nitride hard mask, comprising:
   introducing trimethylsilane into a chamber at a first flow rate;
   introducing silane into the chamber at a second flow rate, wherein the ratio of the second flow rate to the first flow rate is between about 50:1 and about 1:1;
   introducing $NH_3$ into the chamber; and
   reacting the trimethylsilane, silane, and $NH_3$ in the presence of RF power to deposit the carbon-doped silicon nitride hard mask on a substrate in the chamber.

2. The method of claim 1, wherein the first flow rate is between about 2 sccm and about 2000 sccm, the second flow rate is between about 20 sccm and about 2000 sccm, and the $NH_3$ is introduced into the chamber at a flow rate of between about 100 sccm and about 15000 sccm.

3. The method of claim 1, wherein the RF power is provided at a power level of between 20 W and about 1600 W.

4. The method of claim 1, wherein the substrate is maintained at a temperature between about 480° C. and about 600° C.

5. The method of claim 1, further comprising patterning the carbon-doped silicon nitride hard mask and transferring the pattern in the carbon-doped silicon nitride hard mask through a layer of the substrate.

6. A method of forming a carbon-doped silicon nitride hard mask, comprising:
   introducing a first precursor into a chamber at a first flow rate, wherein the first precursor is selected from the group consisting of methylsilane, dimethylsilane, trimethylsilane, ethylsilane, disilanomethane, bis(methylsilano)methane, 1,2-disilanoethane, 1,2-bis(methylsilano)ethane, 2,2-didilanopropane, dimethylsilane, propylesilane, vinylmethylsilane, 1,1,2,2-tetramethyldisilane, hexamethyldisilane, 1,1,2,2,3,3-hexamethyltrisilane, 1,1,2,3,3-pentamethyltrisilane, 1,3-bis (methylsilano)propane, 1,2-bis(dimethylsilane)ethane, 1,3-bis (dimethylsilane)propane, a hydrocarbon compound, and a compound comprising carbon, nitrogen, and hydrogen;
   introducing a second precursor into the chamber at a second flow rate, wherein the second precursor is selected from the group consisting of silane and tetraethoxysilane (TEOS);
   introducing a nitrogen source into the chamber; and
   reacting the first precursor, second precursor, and nitrogen source in the presence of radio frequency (RF) power to deposit the carbon-doped silicon nitride hard mask on a substrate in the chamber, wherein a ratio of the second flow rate to the first flow rate is between about 50:1 and about 1:1.

7. The method of claim 6, wherein the second precursor is silane.

8. The method of claim 7, wherein the nitrogen source is ammonia ($NH_3$).

9. The method of claim 6, wherein the second precursor is tetraethoxysilane (TEOS).

10. The method of claim 6, wherein the first precursor is trimethylsilane.

11. The method of claim 6, wherein the first precursor is a hydrocarbon compound or a compound comprising carbon, nitrogen, and hydrogen.

12. The method of claim 6, wherein the substrate is maintained at a temperature between about 480° C. and about 600° C.

13. The method of claim 6, further comprising patterning the carbon-doped silicon nitride hard mask and transferring the pattern in the carbon-doped silicon nitride hard mask through a layer of the substrate.

14. The method of claim 6, wherein the ratio of the second flow rate to the first flow rate is between about 10:1 and about 1:1.

* * * * *